United States Patent
Schivalocchi (10) Patent No.: US 11,380,647 B2
(45) Date of Patent: Jul. 5, 2022

(54) SINTERING PRESS AND METHOD FOR SINTERING ELECTRONIC COMPONENTS ON A SUBSTRATE

(71) Applicant: AMX—AUTOMATRIX S.R.L., Brescia (IT)

(72) Inventor: Nicola Schivalocchi, Brescia (IT)

(73) Assignee: AMX—AUTOMATRIX S.R.L., Brescia (IT)

(*) Notice: Subject to any disclaimer, the term of this patent is extended or adjusted under 35 U.S.C. 154(b) by 606 days.

(21) Appl. No.: 16/475,395

(22) PCT Filed: Dec. 29, 2017

(86) PCT No.: PCT/IB2017/058520
§ 371 (c)(1),
(2) Date: Jul. 2, 2019

(87) PCT Pub. No.: WO2018/122795
PCT Pub. Date: Jul. 5, 2018

(65) Prior Publication Data
US 2019/0326250 A1  Oct. 24, 2019

(30) Foreign Application Priority Data
Jan. 2, 2017  (IT) .................. 102017000000191

(51) Int. Cl.
*G11C 16/04* (2006.01)
*H01L 23/00* (2006.01)

(52) U.S. Cl.
CPC .............. *H01L 24/75* (2013.01); *H01L 24/83* (2013.01); *H01L 24/97* (2013.01);
(Continued)

(58) Field of Classification Search
CPC ......... H01L 24/75; H01L 24/83; H01L 24/97; H01L 2224/75251; H01L 224/75252
See application file for complete search history.

(56) References Cited

U.S. PATENT DOCUMENTS

| | | | |
|---|---|---|---|
| 2005/0280189 A1* | 12/2005 | Macke, Jr. | ............ B29C 64/135 29/458 |
| 2007/0175021 A1 | 8/2007 | Speckels et al. | |

(Continued)

FOREIGN PATENT DOCUMENTS

| | | |
|---|---|---|
| DE | 102006003735 A1 | 8/2007 |
| DE | 102008 048869 A1 | 4/2010 |

(Continued)

*Primary Examiner* — Pho M Luu
(74) *Attorney, Agent, or Firm* — ArentFox Schiff LLP; Michael Fainberg (57) ABSTRACT

A sintering press to sinter electronic components on a substrate comprises a pressing unit comprising a multi-rod cylinder having a front head and a rear head which jointly delimit a compression chamber. In the front head, presser rods parallel and independent of each other are slidingly supported. Each presser rod is coaxial and barycentric to a respective electronic component to be sintered and has a thrust section proportional to the force to be applied to the respective electronic component. In the compression chamber a sealing membrane extends, which is deformed so as to abut against the presser rods for transferring the sintering pressure on each presser rod.

14 Claims, 8 Drawing Sheets

(52) U.S. Cl.
CPC .............. *H01L 2224/7532* (2013.01); *H01L 2224/7565* (2013.01); *H01L 2224/7592* (2013.01); *H01L 2224/7598* (2013.01); *H01L 2224/75251* (2013.01); *H01L 2224/75252* (2013.01); *H01L 2224/75304* (2013.01); *H01L 2224/75502* (2013.01); *H01L 2224/8384* (2013.01); *H01L 2224/83203* (2013.01); *H01L 2924/13055* (2013.01); *H01L 2924/13091* (2013.01)

(56) References Cited

U.S. PATENT DOCUMENTS

| | | |
|---|---|---|
| 2010/0007846 A1 | 1/2010 | Fermigier et al. |
| 2010/0078463 A1 | 4/2010 | Speckels et al. |
| 2013/0240115 A1 | 9/2013 | Horng |
| 2018/0179988 A1* | 6/2018 | Norris .................... F16C 11/12 |
| 2021/0170708 A1* | 6/2021 | Schivalocchi ........ B30B 11/027 |

FOREIGN PATENT DOCUMENTS

| | | |
|---|---|---|
| JP | 2002110744 A | 4/2002 |
| JP | 2004119594 A | 4/2004 |

\* cited by examiner

SINTERING PRESS AND METHOD FOR SINTERING ELECTRONIC COMPONENTS ON A SUBSTRATE

CROSS-REFERENCE TO RELATED APPLICATIONS

This application is the U.S. National Stage Application of International Patent Application No. PCT/IB2017/058520, filed on Dec. 29, 2017, which claims priority to Italian Patent Application No. 102017000000191, filed on Jan. 2, 2017, the contents of each of which is incorporated herein by reference in its entirety.

The present invention relates to a press for sintering electronic components on a substrate and to a sintering method using such a press.

As is known, in some electronic applications, integrated electronic components, such as diodes, IGBTs, thermistors, MOSFETs, are fixed to a substrate by the interposition of a layer of sintering glue.

In order for each component to be sintered correctly, it must be pressed with a force proportional to its projection surface and subjected to a predetermined temperature for a predetermined period of time. Since the electronic components to be fixed on a substrate can have dimensions, i.e., the projection surfaces of the corresponding casings and thicknesses, even considerably different from each other, the application of a pressure on a single presser member acting on all the components of a substrate does not allow the desired strength to be imparted on all components.

Furthermore, it is worth considering further complications due to the fact that the glue layer may have a thickness which is not perfectly identical and homogeneous for all the components.

In order to obviate these drawbacks, pressing devices consisting of a grid of individual pressing rolls have been proposed. However, it is apparent that this solution is particularly complex and expensive to be implemented.

The object of the present invention is to provide a press and a method for sintering electronic components on a support, capable of overcoming the drawbacks and limitations of the devices according to the prior art.

Said object is achieved with a sintering press according to claim 1 and with a sintering method according to claim 10.

The dependent claims describe preferred embodiments of the invention.

According to a general embodiment, the sintering press comprises a pressing unit comprising a multi-rod cylinder having a front head and a rear head which jointly delimit a compression chamber.

In the front head, presser rods parallel and independent of each other are slidingly supported. Each presser rod is coaxial to a respective electronic component to be sintered and has a thrust section proportional to the force to be applied to the respective electronic component, the area of each electronic component to be sintered and for a predetermined sintering pressure being known.

In the compression chamber, a sealing membrane extends which hermetically divides the compression chamber into a rear chamber and a front chamber. The rear chamber is in fluidic communication with an inlet passage of a fluid under pressure to achieve the sintering pressure. The rear ends of the presser rods protrude in the front chamber. The sealing membrane is placed in contact with the rear ends of the presser rods so that when the rear chamber is pressurised to the sintering pressure, the sealing membrane is deformed by abutting against the rear ends for transferring the sintering pressure on each presser rod.

Therefore, such a press allows to exert a thrust force on each electronic component to be sintered proportional to the surface thereof, due to the use of a presser rod for each component, the section of said presser rod being chosen according to the surface to be pressed.

The structure of the press, however, consists of a small number of components and is particularly compact, due to the use of a single cylinder, which forms a single compression chamber, and a single sealing membrane which performs both a sealing function for all presser rods, and a piston function which acts on all the presser rods, deforming so as to adapt to their dimensions.

In one embodiment, the sealing membrane is held peripherally between the front and rear heads of the multi-rod cylinder.

Therefore, the sealing membrane deforms when subjected to the action of the fluid under pressure, but does not translate axially with respect to the compression chamber.

In one embodiment, the pressing unit further comprises a heating block integral with the multi-rod cylinder and which slidingly supports presser heating members. Each presser heating member is coaxial to a respective presser rod and can be actuated by the presser rod to act on a respective electronic component to be sintered.

The heating block is provided with heating means for heating the presser heating members.

Therefore, in this embodiment, the heat necessary for the sintering process is transmitted to the electronic components by the same members which exert the pressing action. The use of a specific heating block allows to simplify the structure of the multi-rod cylinder, which thus performs only the thrust function and not also the heating of the electronic components.

In one embodiment, the presser heating members are in the form of bars having a cross section substantially corresponding to the area of the casing of the respective electronic component to be sintered, or greater than such an area. The presser rods act in a barycentric position with respect to the corresponding electronic component; this allows the pressure members to distribute the thrust force received from the presser rods as evenly as possible on the surface of the electronic components.

In one embodiment, the presser heating members slide with transverse clearance in respective axial seats formed in the heating block, so as to adapt to possible inclinations of the electronic components with respect to the plane defined by the substrate.

In one embodiment, the pressing unit comprises a peripheral frame which supports a protective film, for example PTFE, which extends beyond the front ends of the presser rods or, when present, of the presser heating members. Suction and blowing means are directed towards said protective film and can be activated, in suction, to make the protective film adhere to the front ends of the presser rods or members which contact the electrical components before the pressing action, and in blowing to remove the protective film from such front ends at the end of the pressing action.

In one embodiment, the press comprises a support unit facing the pressing unit and adapted to support at least one substrate.

At least one of the pressing unit and the support unit can be axially translated with respect to the other between a retracted rest position and an advanced pressing position, in which the electronic components can be engaged by the rods or by the presser members.

For example, the press comprises a frame which supports both the pressing unit and the support unit and which is provided with longitudinal guides along which at least one of the pressing unit and the support unit slides, for example under the action of an oleodynamic or electric actuator.

In one embodiment, the support unit comprises a fixed reaction block, which supports the thrust exerted by the multi-rod cylinder, a heating block, and a movable reaction block.

The heating block allows the heat necessary to sinter the components to be brought from underneath the substrate.

In one embodiment, at least one deformation cylinder is housed in the fixed reaction block to which a respective deformation sensor is associated.

More in detail, the fixed reaction block supports the deformation cylinders with the respective deformation sensors, which transduce the sum of the compressive forces exerted by the compression rods through the pressers, the substrate and the movable reaction block. Preferably, since the deformation sensor has to work at a temperature higher than 150° C., it is a quartz deformation sensor.

The sintering method which uses the above sintering press comprising the steps of:

a. positioning a substrate with the electronic components to be sintered so that the electronic components contact the front ends of the presser rods or the presser heating members;

b. heating the presser rods or the presser heating members to a predetermined sintering temperature;

c. pressurising the compression chamber at the predetermined sintering pressure;

d. maintaining the sintering pressure and the sintering temperature for a predetermined sintering time;

e. removing the substrate from the sintering press.

In one embodiment, the substrate is also heated to a sintering temperature.

In one embodiment, before step a.), the protective film is made to adhere to the ends of the presser rods or the presser heating members.

In one embodiment, after step e.), the compression chamber is brought to a lower pressure than the sintering pressure, but higher than the atmospheric pressure, such that the presser rods and the possible presser heating elements act as blank holders for the subsequent contact with a new substrate.

The features and advantages of the sintering press and method according to the invention will become readily apparent from the following description of preferred embodiments thereof, provided merely by way of a non-limiting example, with reference to the accompanying drawings, in which.

With reference to the accompanying drawings, a sintering section will be described hereinafter using a press 1 according to the invention to perform the sintering of electronic components 10 on a substrate 12.

The substrate 12 arrives at the sintering press 1 contained in a pallet 2, for example adapted to contain six substrates 12.

The substrates 12 are positioned in respective seats formed in the pallet 2 and adapted to support the substrates 12 on suitable projections.

The substrates 12 carry the electronic components 10 to be sintered (for example, IGBTs, diodes, thermistors, MOSFETs) positioned on a layer of sintering glue. The components 10 must be processed with a predefined surface pressure, for example of 30 MPa, at a predefined temperature, for example of 260° C., for 180÷300 seconds.

The pallets 2 with the non-sintered substrates 12 must be handled smoothly without shocks at moderate speeds, in order not to modify the positions of the electronic components 10.

The electronic components 10 must be pressed with a force directly proportional to their projection surface, taking into account that the components have a thickness diversified by family.

Furthermore, any non-parallelism of the substrate-glue-electronic component assembly, for example of 1μ over 10 mm, must be compensated.

Figure 1:
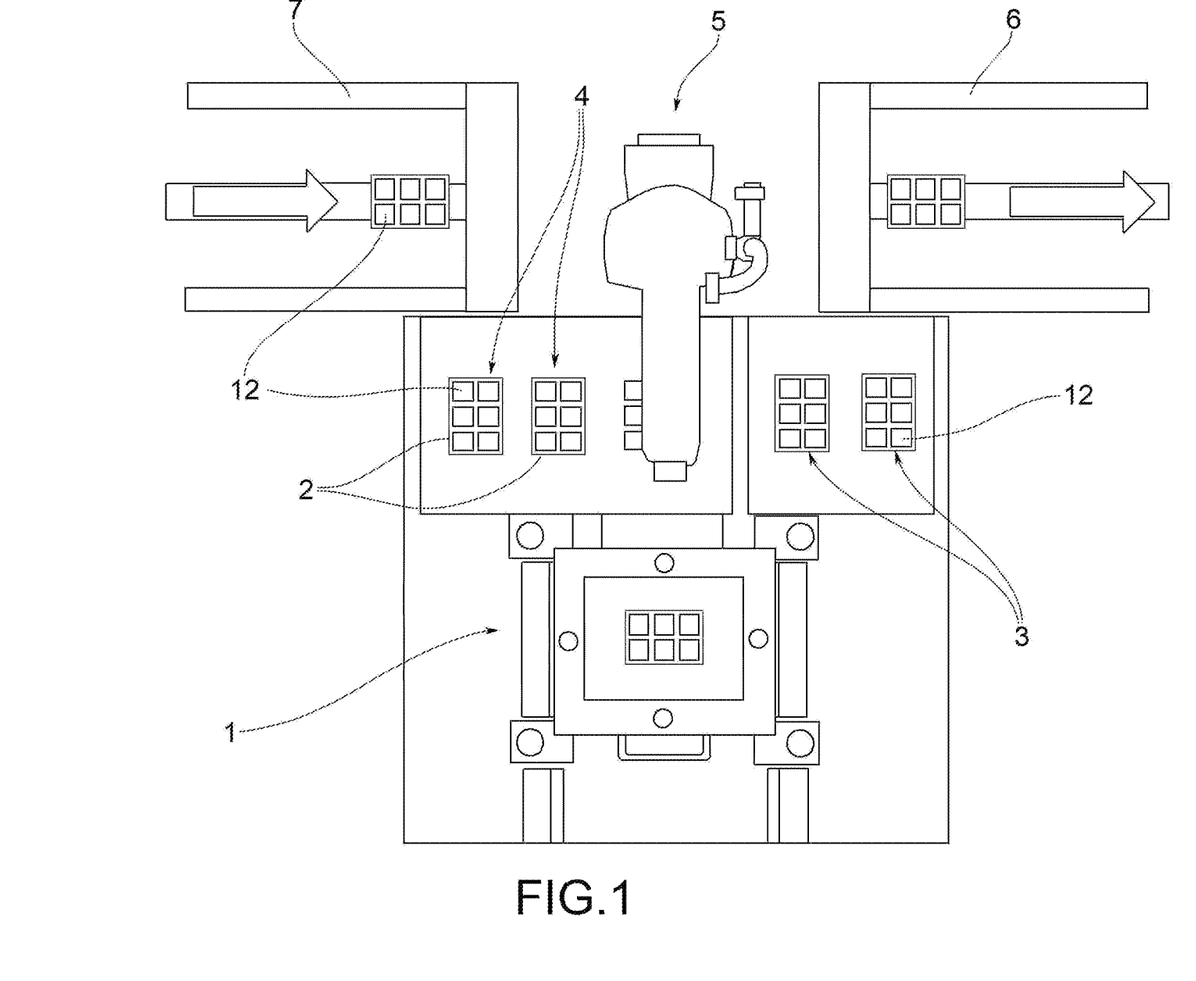
FIG. 1 is a schematic plan view of a sintering section which uses a sintering press according to the present invention.

As shown in FIG. 1, in one embodiment, the sintering section comprises at least one, preferably two preheating stations 3 of the pallets 2 to 150° C., and at least one, preferably three cooling stations 4 of the pallets 2 to 50° C.

In one embodiment, the sintering section comprises an anthropomorphic robot 5, for example of the 6-axis type, of 10 kg, provided with a six-jaw self-centring gripper. The robot 5 manipulates the pallets 12 between:

an inlet conveyor 6 and reader of the two pre-heating stations 3;

the two pre-heating stations 3 and the sintering press 1;

the sintering press 1 and the three cooling stations 4;

the three cooling stations 4 and an outlet conveyor 7.

The two pre-heating stations 3 provide to raise the temperature of the respective substrates 12 to a temperature of 150° C.

For example, the two pre-heating stations 3 are heated by armoured electric cartridges controlled by PID and PWM thermal resistances PT100.

Figure 2:
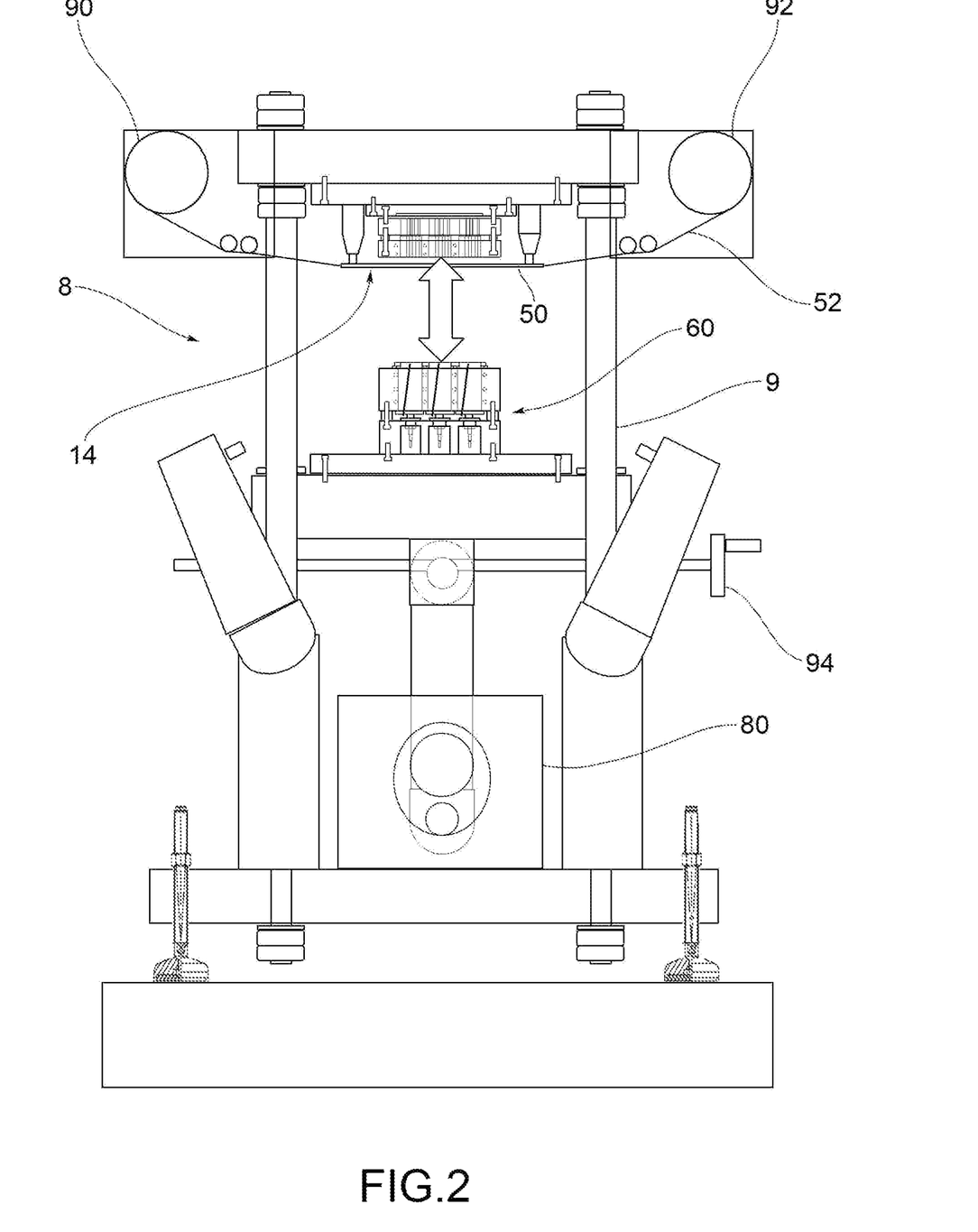
FIG. 2 is an elevation view of the press.

The sintering press 1, illustrated globally in FIG. 2, comprises a vertically extending frame 8 which supports a pressing unit 14 at the top and a support unit at the bottom for at least one substrate 12, preferably six in the example shown.

The frame 8 is provided with longitudinal guides 9 along which the support unit 60 slides, operated by a hydraulic or electric actuator 80.

In one embodiment, the support unit 60 performs a stroke of 200 mm, with uniformly accelerated and decelerated motion.

In particular, the upper position of the support unit 60 is absolutely irreversible and is sized to counteract forces up to 250 KN without moving.

In one embodiment, the stroke of 200 mm is implemented in 3 seconds, with a 1 Kw brushless geared motor 80, and can be implemented in jog at reduced speed for mould changing and maintenance functions.

In one embodiment, the frame 8 also supports a motorized winder 90 and an unwinder 92, for example with brushless gear motors, for the replacement of a protective film 52, for example PTFE, to be interposed between the substrates 12 and the pressing unit 14 during sintering.

In one embodiment, the protective film 52 is supported by a peripheral frame 50. This peripheral frame 50, in one embodiment, also supports suction/blowing means directed towards the protective film 52.

Furthermore, the press 1 is provided with a vacuum pump—not shown—for sucking the air between the PTFE film and the pressing unit 14.

In one embodiment, the press 1 is also provided with a blow ionizing device—not shown—to remove any electrostatic charges in the sintering area.

In one embodiment, the frame 8 also supports horizontal sliding guides which can be inserted and removed with a right-hand and a left-hand handgrip 94, to facilitate the replacement of the support unit 60.

Figure 3:
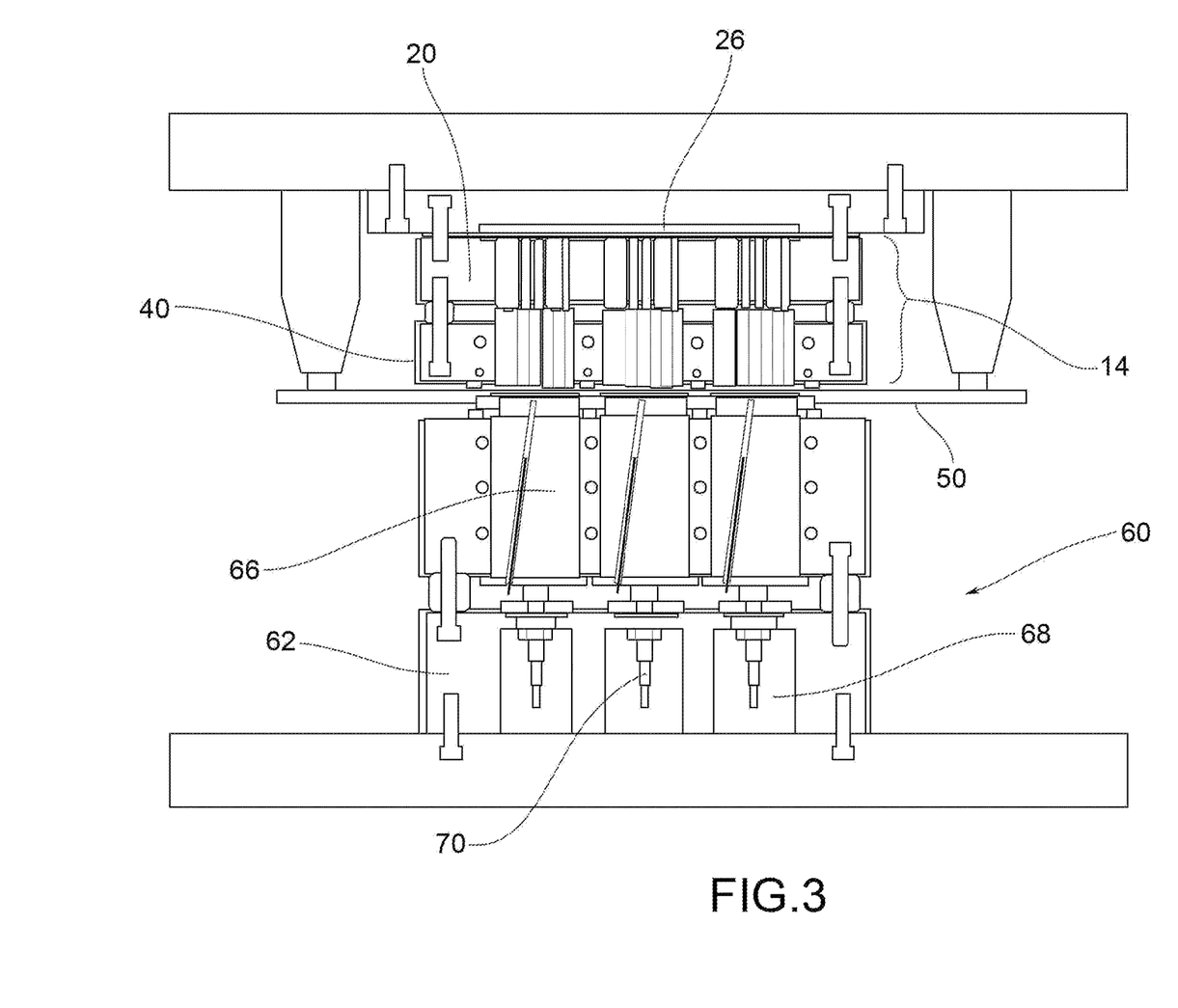
FIG. 3 is an axial section view of the pressing unit closed on the substrate support unit.
Figure 4:
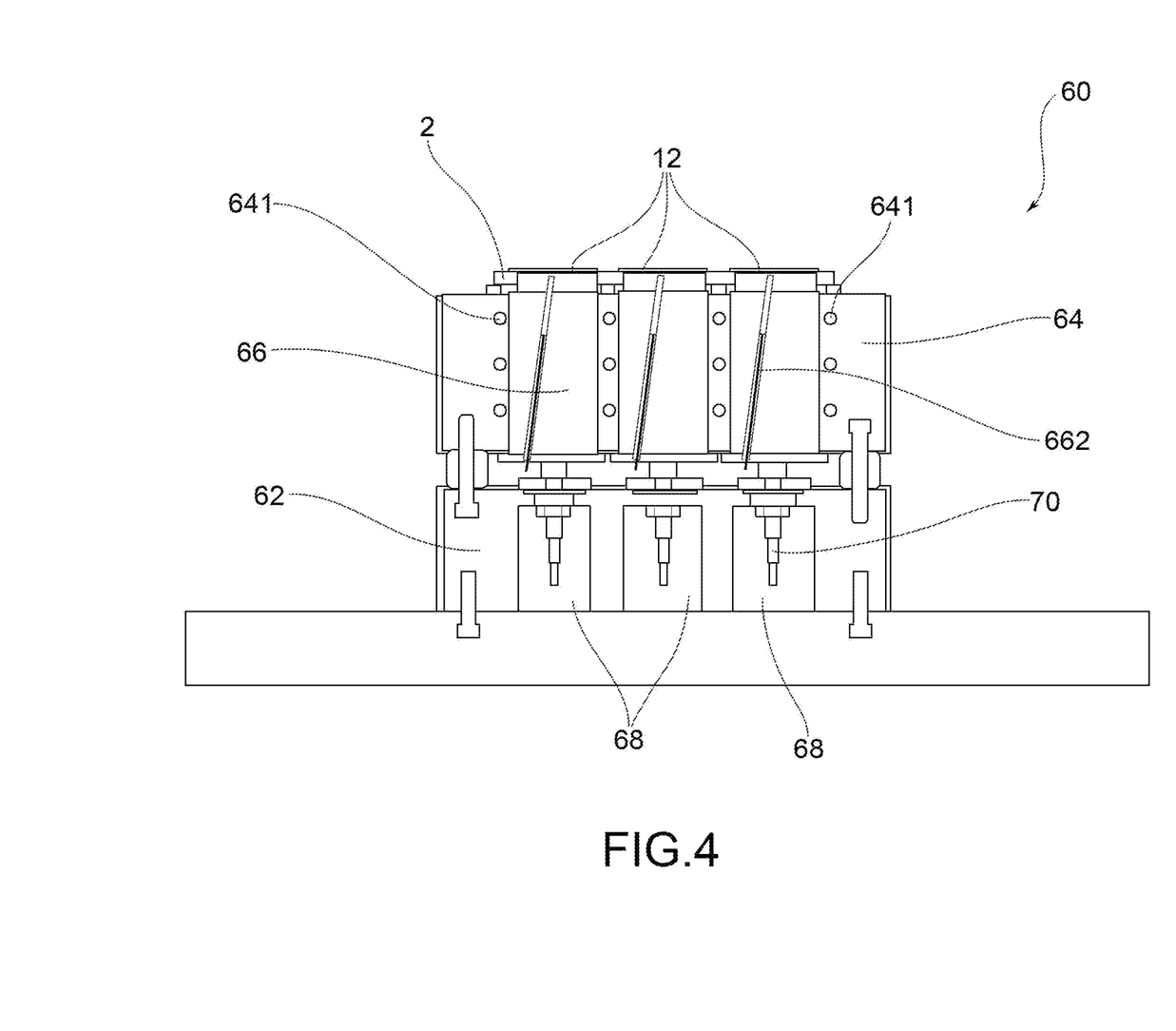
FIG. 4 is an axial section view of only the substrate support unit of the press.

In an embodiment, shown in particular in FIGS. 3 and 4, the support unit 60 comprises a fixed reaction block 62, wherein six deformation cylinders 68 are accommodated, provided with respective deformation sensors 70 able to operate at 350° C.

The support unit 60 further comprises a heating block 64 in which armoured heating resistances 641 are accommodated.

The support unit further comprises six movable reaction blocks 66, each provided with a respective temperature sensor 662.

Figure 5:
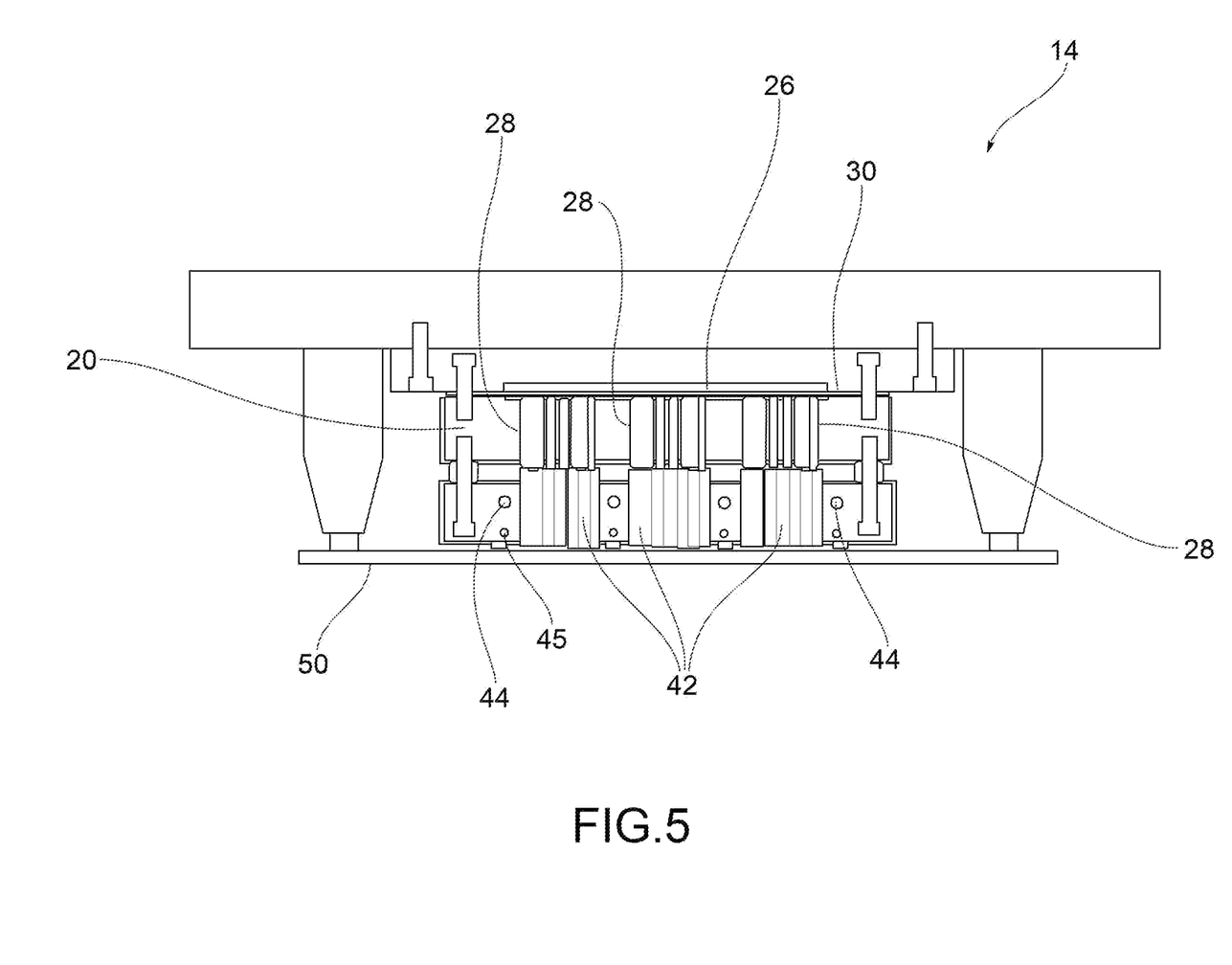
FIG. 5 is an axial section view of only the pressing unit of the press.

In one embodiment shown in particular in FIGS. 3 and 5, the pressing unit 14 comprises a multi-rod compression cylinder 20 having a front head 22 and a rear head 24 which jointly delimit a compression chamber 26.

In the front head 22, presser rods 28 parallel and independent of each other are slidingly supported. Each presser rod 28 is coaxial and barycentric to a respective electronic component 10 to be sintered and has a thrust section proportional to the force to be applied to the respective electronic component 10, the area of each electronic component to be sintered and for a predetermined sintering pressure being known.

The term "barycentric" means that each presser rod has a rod axis which coincides with the centre of gravity of the respective electronic component 10.

In the compression chamber 26, a sealing membrane 30 extends which hermetically divides the compression chamber into a rear chamber 26' and a front chamber 26". The rear chamber 26' is in fluidic communication with an inlet passage 32 of a control fluid. During the operation of the press, the control fluid enters the rear chamber 26' at the sintering pressure. The rear ends 28' of the presser rods protrude in the front chamber 26".

More precisely, the front chamber 26" is delimited by a substantially flat bottom wall 26a, from which the rear ends 28' of the presser rods 28 protrude.

Figure 6:
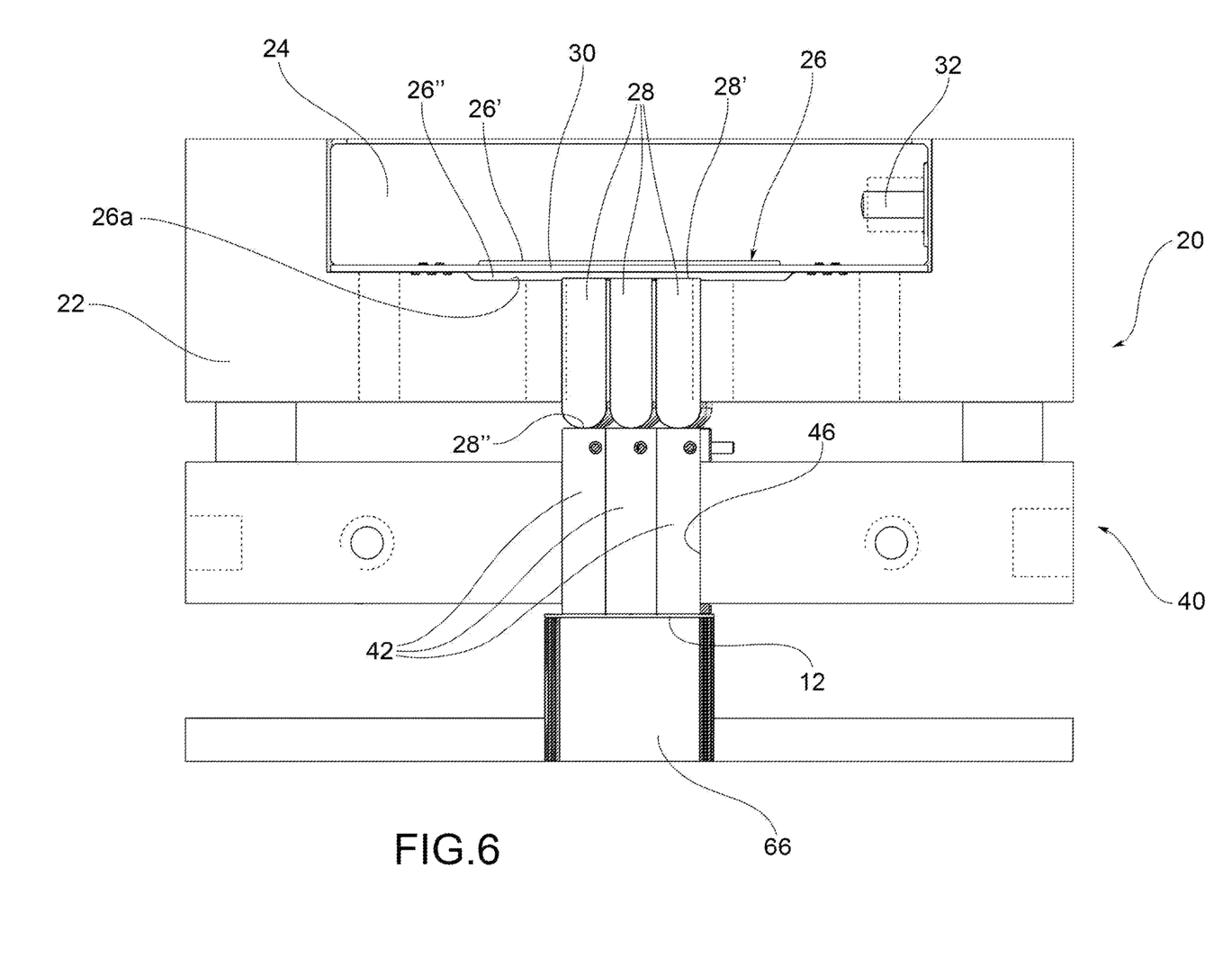
FIG. 6 is an enlarged view of part of the pressing unit and of the substrate support unit, showing in particular the non-pressurised compression chamber and some presser rods and presser heating members in contact with respective electronic components of a substrate.

In the absence of pressure in the compression chamber 26, the sealing membrane 30 is substantially flat and is positioned so as to slightly touch the rear ends 28' of the presser rods 28 (FIG. 6).

Figure 6A:
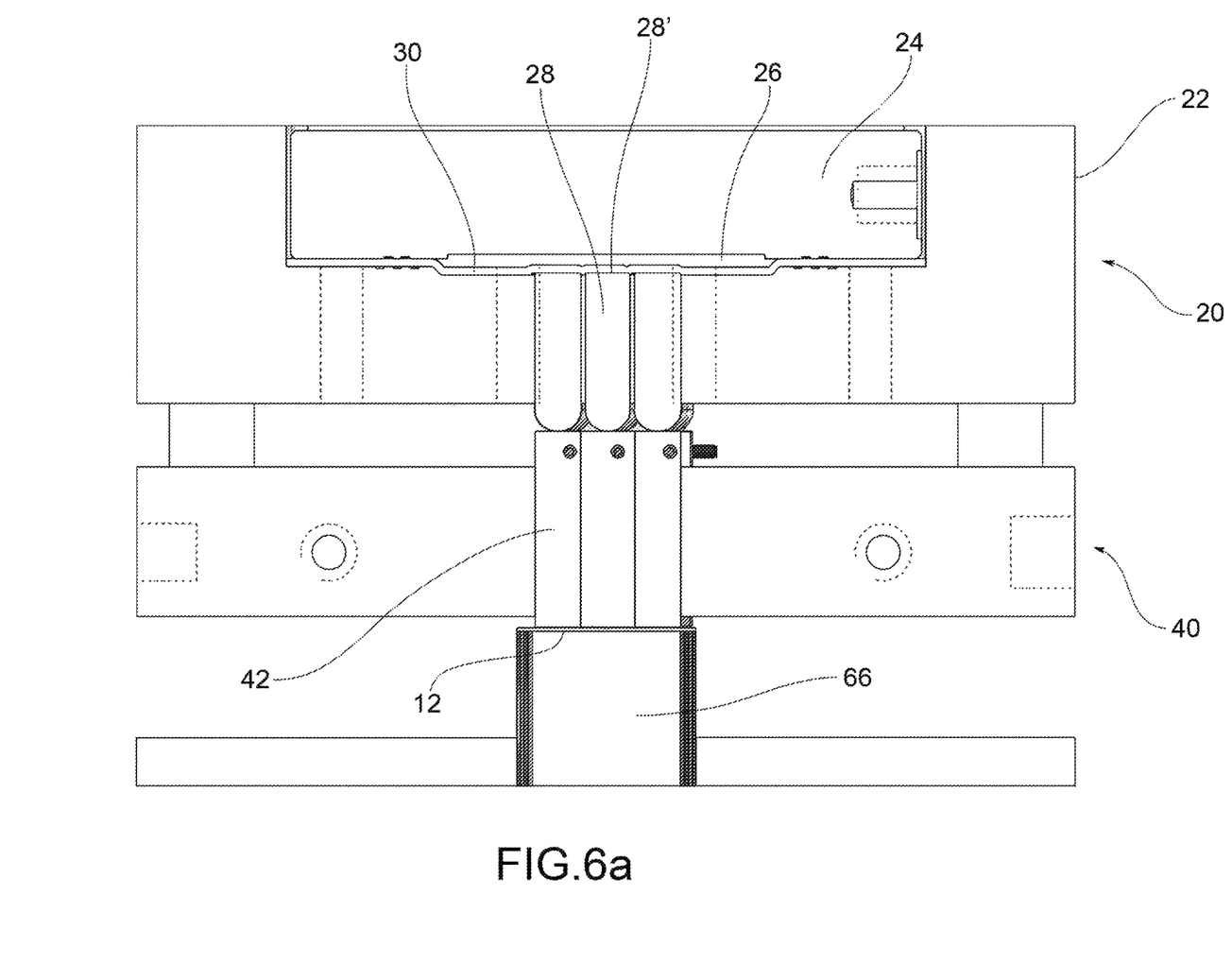
FIG. 6a is a view similar to the preceding one, but with the compression chamber pressurised.

When the rear chamber 26' is pressurised at the sintering pressure, the sealing membrane 30 is deformed, thereby abutting against the rear ends 28' of the presser rods 28 for transferring the sintering pressure on each presser rod 28 (FIG. 6a).

More precisely, the projection of the rear ends 28' of the presser rods 28 with respect to the bottom wall 26a of the front chamber 26", and thus the distance between the sealing membrane 30 and said bottom wall, are selected such that when the rear chamber 26' is pressurised at the sintering pressure and the sealing membrane 30 is deformed, the membrane abuts not only against the rear ends 28' of the presser rods 28, but also against the rear wall 26a of the front chamber 26", as shown in particular in FIG. 6a.

Due to this configuration of the compression chamber, the sealing membrane 30 behaves as if the control fluid acted directly on the single rear ends 28' of the presser rods 28 at the desired sintering pressure. In other words, the sealing membrane 30 simulates the behaviour of a plurality of mutually independent cylinder-piston systems.

In one embodiment, the sealing membrane 30 is held peripherally between the front 22 and rear 24 heads of the multi-rod cylinder 20.

In one embodiment, the pressing unit 14 further comprises a heating block 40 integral with the multi-rod cylinder 20 and which slidingly supports presser heating members 42. Each presser heating member 42 can be actuated by a respective presser rod 28 to act on a respective electronic component 10 to be sintered.

Figure 7:
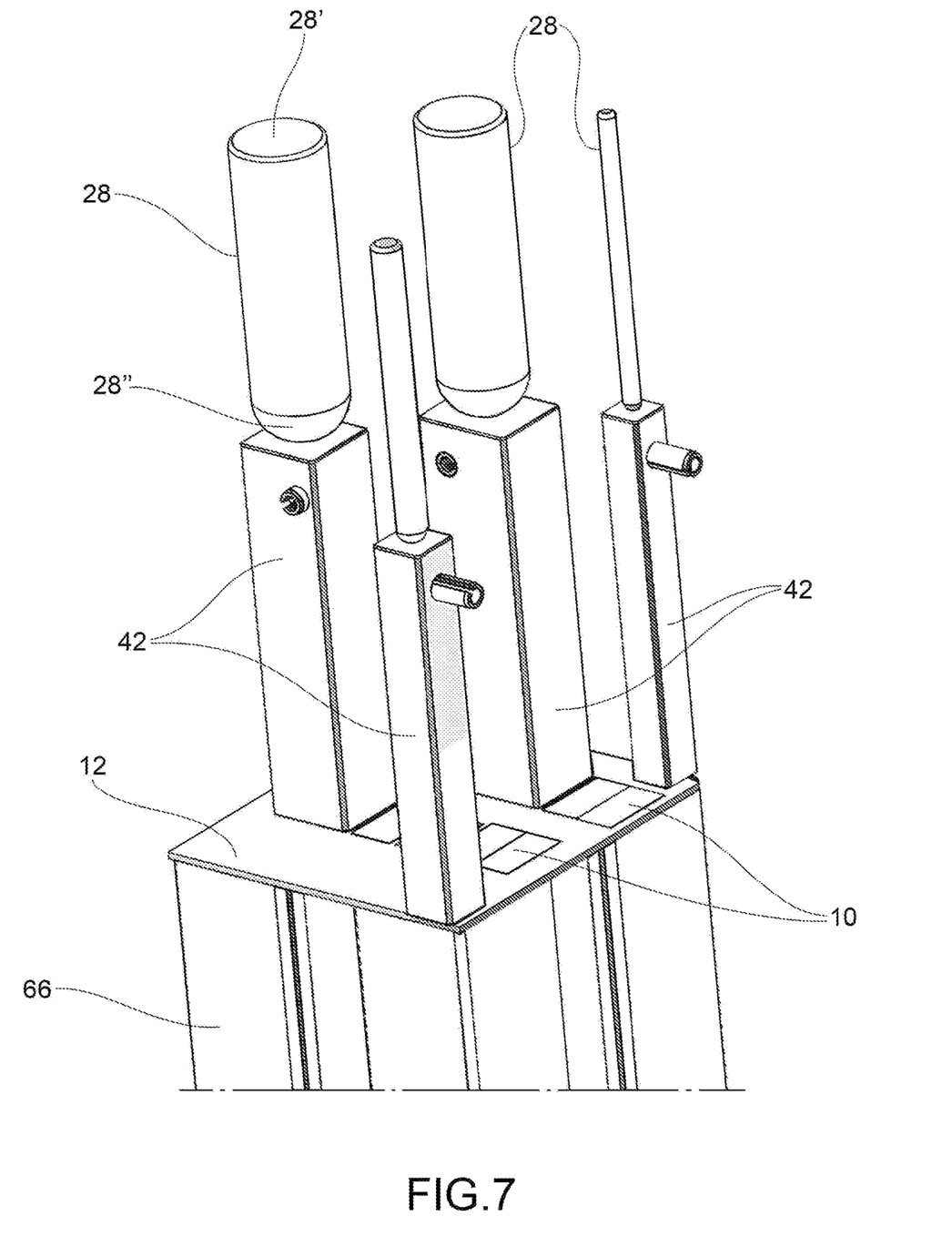
FIG. 7 is a perspective view of some presser rods and presser heating members in contact with electronic components of a substrate.

The perspective view in FIG. 7 shows four presser rods 28, of different sections, which act on respective presser heating members 42, also of different section.

The presser heating members 42 are shown in abutment on the respective electronic components 10, resting on a substrate 12 supported by the support unit 60.

In one embodiment, the presser rods 28 have rounded front ends 28" which are in contact with flat surfaces 42' of the presser heating members 42. For example, the front ends 28" of the presser rods 28 are spherically rounded to concentrate the compressive force in the barycentric point of the corresponding electronic component to be sintered and at the same time to make a thermal break between the presser rods 28 and the presser members 42. In this way, the presser heating members 42 can easily adapt to the surface of the electronic components to be pressed and heated.

In one embodiment, the presser heating members 42 are in the form of bars having a cross section substantially corresponding to or greater than the area of the casing of the respective electronic component 10 to be sintered.

In one embodiment, the multi-rod cylinder 20 is capable of imparting to the single presser rods 28 a force proportional to the cross-section thereof, to develop a pressure corresponding to 30 MPa on all the electronic components 10.

In one embodiment, for each substrate 12 there are provided four presser rods and members for IGBTs, presser rods and members for diodes, a presser rod and members for a thermistor, a presser rod and a member for MOSFET, for a total of 48 presser members and presser rods thereof, all independent and of differentiated section proportional to the thrust to be developed.

In one embodiment, the compression chamber 26 can be pressurised up to 35 MPa (350 bar).

As said, the presser heating members 42 have the task of transmitting the compression force and the heating to the electronic components 10 to be sintered on the substrate 12.

In one embodiment, the heating block 40 is provided with armoured resistances 44 and temperature sensors 45.

The presser members 42 are pushed barycentrically with respect to the corresponding electronic component 10 to be sintered on the substrate, and slide into the heating block 40 with a suitable clearance to allow them an adjustment to a parallelism of 1 μm over 10 mm.

It should be noted that if the thicknesses of the electronic components 10 change, they do not cause changes in the sintering pressure of the other components.

It should be noted that, as mentioned above, while the axis of each presser rod 28 must coincide with the centre of gravity of the respective electronic component 10, the shape, the section and the position of the presser members 42 with respect to the axis of the respective presser rods 28 can be selected according to the shape of the electronic components 10 and/or the position thereof on the substrate.

For example, the presser members 28 can be selected so as to sinter electronic components 10 which are also very close to each other or of a non-rectangular or very different size in a reliable and precise manner.

It should also be noted that the implementation of each presser member of the pressing unit 14 in two separate components, the presser rods 28 and the presser members 42, placed in contact through a substantially spherical surface 28", allows to obtain a thermal break between the multi-rod cylinder 20 and the heating block 40. For example, while the heating block 40 operates at a temperature capable of reaching 300° C., the multi-rod cylinder 20, connected to a cooling circuit, can be kept below 100° C.

The multi-rod cylinder 20 thus cooled undergoes less wear than the heating block 40 and can be replaced much less frequently.

A sintering cycle will now be described.

While a sintering step is in progress, the robot 5 manages the pallets 2 which arrive in the inlet conveyor 6, picks them up and deposits them in one of the two free pre-heating stations 3.

During the sintering step, the robot 5 also manages the pallets 2 which are stationed in the three cooling stations 4. At the end of the programmed cooling cycle, the robot picks the pallet from the corresponding cooling station and deposits it in the outlet conveyor 7.

At the end of the sintering step, the following steps are carried out in succession.

The multi-rod cylinder 20 is depressurised from about 35 MPa to about 0.5 MPa. In this way, the presser heating members 42 act as blank holders having a predefined force.

The depressurisation of the multi-rod cylinder is controlled by the pressure sensors contained in the reaction block of the support unit 60.

The support unit, from the advanced pressing position, descends with a uniformly accelerated and decelerated movement completing a stroke of 200 mm.

The peripheral frame 50 drops by 10 mm, thus releasing the protective film 52.

The vacuum pump of the pressing unit 14 is then gently pulse-pressurised to detach the film from the presser members.

The unwinding reel and the winding reel of the protective film are actuated, in order to position a portion of integral film under the pressers of the pressing unit. This operation must preferably be carried out with the pallet containing the newly sintered substrates still present. This prevents glue or film residues from falling on the support unit 60 or worse on the substrates still to be sintered.

The robot picks the pallet from the press and deposits it in a free station of the three cooling stations.

The robot picks the pallet with the substrates to be sintered, which has completed the preheating cycle at 150° C., and deposits it gently in the support unit 60.

The vacuum is then activated between the pressing unit 14 and the protective film, making the film adhere to the presser members of the pressing unit 14.

As soon as the robot leaves the collision area, the support unit 60 rises with a uniformly accelerated and decelerated motion. In particular, in one embodiment, in the last 15 millimetres of travel of the support unit 60 with the pallet and the corresponding substrates, the support unit 60 impacts with the peripheral frame 50 of the pressing unit 14, thus lifting it. In the last 2 millimetres of travel of the support unit 60, the substrates centred in the pallet housings and resting directly on the respective movable reaction blocks of the support unit 60, impact with the presser members covered by the protective film.

The presser members 42, which in this step are slightly pressurised, retract, thus acting as blank holders.

The support unit 60 reaches the upper stroke end position.

The multi-rod cylinder is pressurised at the programmed pressure.

The pressurisation of the multi-rod cylinder is controlled by the corresponding deformation sensors, which measure the cumulative compressive force applied by the pressers on each substrate.

In one embodiment, the sintering temperature of the substrates is generated by armoured cartridge resistances contained in the lower 64 and upper 40 heating blocks.

In one embodiment, the sintering temperature is controlled independently in the pressing unit and in the support unit, for example with suitably positioned thermal resistances PT100.

Preferably, the substrates are heated from below through the movable reaction blocks, and from above through the presser members and the protective film. Since the heating conditions are different, it is possible to differentiate the heating temperatures below and above in order to compensate for differences in the heat transmission to the substrates.

In one embodiment, the electronic components on the substrates are maintained for a programmed time (for example 300 seconds) at the temperature of 260° C., and pressed at 30 MPa, to carry out the sintering of the components on the substrates.

Once the sintering time has elapsed, the multi-rod cylinder is depressurised and the press re-opens as described above.

Those skilled in the art may make several changes, adjustments, adaptations to the embodiments of the sintering press and method thereof according to the invention, or replace elements with others which are functionally equivalent, in order to meet incidental needs, without departing from the scope of the following claims. Each of the features described as belonging to a possible embodiment can be achieved irrespective of the other embodiments described.

The invention claimed is:

1. A sintering press to perform a sintering of electronic components on a substrate, comprising a pressing unit comprising a multi-rod cylinder having a front head and a rear head which jointly delimit a compression chamber, in said front head presser rods parallel and independent of each other being slidingly supported, each presser rod having a rod axis coincident with the barycenter of the respective electronic component to be sintered and having a thrust section proportional to the force to be applied to the respective electronic component, the area of each electronic component to be sintered being known, and for a predetermined sintering pressure, in which in the compression chamber a sealing membrane extends which hermetically divides the compression chamber into a rear chamber and a front chamber, the rear chamber being in fluidic communication with an inlet passage of a fluid under pressure at the sintering pressure, the rear ends of the pressure rods projecting into the front chamber, the sealing membrane being placed to skim said rear ends (28') of the pressure rods so that, when the rear chamber is pressurised at the sintering pressure, the sealing membrane is deformed so as to abut against said rear ends for a transfer of the sintering pressure on each presser rod.

2. A press according to claim 1, wherein the sealing membrane is held peripherally between the front and rear heads of the multi-rod cylinder.

3. A press according to claim 1, wherein the pressing unit further comprises a heating block integral with the multi-rod cylinder and which slidingly supports presser heating members, each presser heating member being actuatable by a respective presser rod to act on a respective electronic component to be sintered, the heating block being provided with heating means for heating the presser heating members, each presser rod ending with a rounded end of contact with a flat end surface of a respective presser member.

4. A press according to claim 3, wherein the presser heating members are in the form of bars having a cross section substantially corresponding to or greater than the area of the casing of the respective electronic component to be sintered.

5. A press according to claim 3, wherein the presser heating members slide with transverse clearance in respective axial seats made in the heating block, so as to adapt to possible inclinations of the electronic components with respect to the plane defined by the substrate.

6. A press according to claim 1, wherein the pressing unit comprises a peripheral frame which supports a protective film, for example PTFE, which extends beyond the front ends of the pressure rods or, when present, of the presser heating members, and suction/blowing means facing said protective film and adapted to make the protective film adhere to/peel off said front ends.

7. A press according to claim 1, comprising a support unit facing the pressing unit and adapted to support at least one substrate, at least one of said pressing unit and support units being axially movable relative to the other between a retracted rest position and an advanced pressing position in which the electronic components are engageable by the presser rods or by the presser heating members.

8. A press according to claim 7, wherein said support unit comprises a fixed reaction block, a heating block adapted to heat each substrate, and a movable reaction block.

9. A press according to claim 8, wherein at least one deformation cylinder to which a respective deformation sensor is associated is housed in the fixed reaction block.

10. A sintering method of electronic components on a substrate by means of a sintering press according to claim 1, comprising the steps of:
   a) positioning a substrate with the electronic components to be sintered so that the electronic components come into contact with the front ends of the pressure rods or of the presser heating members;
   b) heating the pressure rods or the presser heating members to a predetermined sintering temperature;
   c) pressurising the compression chamber at the predetermined sintering pressure;
   d) maintaining the sintering pressure and the sintering temperature for a predetermined sintering time;
   e) removing the substrate from the sintering press.

11. A method according to claim 10, wherein also the substrate is heated to a sintering temperature.

12. A method according to claim 10, wherein, before step a), a protective film is made to adhere to the ends of the pressure rods or the presser heating members.

13. A method according to claim 10, wherein, after step e), the compression chamber is brought to a lower pressure than the sintering pressure, but higher than the atmospheric pressure, so that the presser rods and possible pressure heating members act as blank holders.

14. A method according to claim 10, wherein, during the step of pressurising the compression chamber at the predetermined sintering pressure, the sealing membrane is deformed so as to come into contact both on the rear ends of the presser rods and on a substantially flat bottom wall of the front portion of the compression chamber.

\* \* \* \* \*